(12) United States Patent
Merrill et al.

(10) Patent No.: US 6,509,606 B1
(45) Date of Patent: *Jan. 21, 2003

(54) SINGLE POLY EPROM CELL HAVING SMALLER SIZE AND IMPROVED DATA RETENTION COMPATIBLE WITH ADVANCED CMOS PROCESS

(75) Inventors: Richard B. Merrill, Woodside, CA (US); Albert Bergemont, Palo Alto, CA (US); Min-hwa Chi, Palo Alto, CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/053,199

(22) Filed: Apr. 1, 1998

(51) Int. Cl.[7] .............................................. H01L 29/788
(52) U.S. Cl. ................... 257/321; 365/185.27; 438/263; 438/594
(58) Field of Search ..................... 257/321; 365/185.27; 438/263, 594

(56) References Cited

U.S. PATENT DOCUMENTS

| | | | | |
|---|---|---|---|---|
| 4,869,781 A | * | 9/1989 | Euen et al. .................. | 257/403 |
| 5,280,446 A | | 1/1994 | Ma et al. ................. | 365/185.15 |
| 5,414,271 A | * | 5/1995 | Ovshinsky et al. ............ | 257/3 |
| 5,457,652 A | | 10/1995 | Brahmbhatt ........... | 365/185.06 |
| 5,465,231 A | * | 11/1995 | Ohsaki ................... | 365/185.33 |
| 5,491,657 A | | 2/1996 | Haddad et al. ......... | 365/185.27 |
| 5,515,319 A | | 5/1996 | Smayling et al. ....... | 365/185.27 |
| 5,612,913 A | | 3/1997 | Cappelletti et al. .... | 365/185.12 |
| 5,761,121 A | * | 6/1998 | Chang .................... | 365/185.14 |
| 5,761,126 A | | 6/1998 | Chi et al. .............. | 365/185.27 |
| 6,017,792 A | * | 1/2000 | Sharma et al. .............. | 438/257 |

OTHER PUBLICATIONS

Ohski, K. et al., "A Single Poly EEPROM Cell Structure for Use in Standard CMOS Processes", IEEE J. Solid–State Circits, vol. 29, No. 3, pp. 311–316, Mar. 1994.*

Ohnakado, T., et al., "Novel Electron Injection Method Using Band–to–Band Tunneling Induced Hot Electron (BBHE) for Flash Memory with a P–channel Cell," IEDM 1995, pp. 279–282.

Chan, T. y., et al., "The Impact of Gate–Induced Drain Leakage Current on MOSFET Scaling," IEDM, 1987, 4 pages.

Chi et al., *Single–Poly EEPROM Cell That is Programmable and Erasable in a Low–Voltage Environment*, Co–pending U.S. patent application Ser. No. 09/053,284 filed Apr. 1, 1998.

* cited by examiner

*Primary Examiner*—Olik Chaudhuri
*Assistant Examiner*—Howard Weiss
(74) *Attorney, Agent, or Firm*—Stallman & Pollock LLP

(57) ABSTRACT

Leakage of a single-poly EPROM cell is prevented by eliminating field oxide isolating the source, channel, and drain from the control gate n-well, and by replacing field oxide surrounding the cell with a heavily doped surface isolation region. The EPROM cell also utilizes a floating gate having an open-rectangular floating gate portion over the control gate region, and a narrow floating gate portion over the channel and intervening silicon substrate. The surface area of the open-rectangular floating gate portion ensures a high coupling ratio with the control gate region. The small width of the narrow floating gate portion prevents formation of a sizeable leakage path between the n-well and the source, channel, and drain. To conserve surface area, the EPROM cell also eliminates the p+ contact region and the PLDD region in the control gate well of the conventional EPROM design. This is permitted because the $V_{Tp}$ implant step is masked, permitting the control gate region to operate in accumulation mode during application of 5V programming voltages.

3 Claims, 3 Drawing Sheets

SINGLE POLY EPROM CELL HAVING SMALLER SIZE AND IMPROVED DATA RETENTION COMPATIBLE WITH ADVANCED CMOS PROCESS

BACKGROUND OF THE INVENTION

1. Field of the Invention

The present invention relates to a single-poly electrically-programmable read-only-memory (EPROM) cell and, more particularly, to a single-poly EPROM cell that does not incorporate oxide isolation and thereby avoids problems with leakage along the field oxide edge that can lead to degraded data retention.

2. Description of the Related Art

A single-poly electrically-programmable read-only-memory (EPROM) cell is a non-volatile storage device fabricated using process steps that are fully compatible with conventional single-poly CMOS fabrication process steps. As a result, single-poly EPROM cells are often embedded in CMOS logic and mixed-signal circuits.

FIGS. 1A–1C show a series of views that illustrate a conventional single-poly EPROM cell 100. FIG. 1A shows a top view of cell 100, FIG. 1B shows a cross-sectional view taken along line 1B–1B' of FIG. 1A, while FIG. 1C shows a cross-sectional view taken along line 1C–1C' of FIG. 1A.

A. Structure of Conventional EPROM Cell

As shown in FIGS. 1A–1C, EPROM cell 100 includes spaced-apart source and drain regions 114 and 116 respectively, which are formed in a p-type semiconductor material 112 such as a well or a substrate, and a channel region 118 which is defined between source and drain regions 114 and 116. Source 114 includes a source contact 115, and drain 116 includes a drain contact 117.

As further shown in FIGS. 1A–1C, cell 100 also includes an n-well 120 formed over p-type material 112. Field oxide 105 is formed over p-type material 112 to isolate source region 114, drain region 116, and channel region 118 from n-well 120, and also to isolate EPROM cell 100 from the electrical fields of adjacent devices.

N-well 120 of cell 100 further includes adjoining p+ and n+ contact regions 122 and 124 having n+ contact 123 and p+ contact 125 respectively. Conventional EPROM cell 100 also includes a p-type lightly-doped-drain (PLDD) region 126 which adjoins p+ contact region 122.

A rectangular control gate region 128 is defined in n-well 120 between PLDD region 126 and field oxide 105.

A rectangular floating gate oxide 130 is formed over channel region 118. A rectangular control gate oxide 132 is formed over control gate region 128. Floating gate oxide 130 and control gate oxide 132 are typically grown at the same time during fabrication of conventional EPROM cell 100. As a result, oxides 130 and 132 have substantially the same thickness, e.g. approximately 120 Å for 0.5 micron technology, and 70 Å for 0.35 micron technology.

A rectangular floating gate 134 is formed over floating gate oxide 130, control gate oxide 132, and a portion of field oxide 105.

B. Operation of Conventional EPROM Cell

During operation, conventional EPROM cell 100 is programmed by applying a first positive programming voltage of approximately 12 volts to contact regions 122 and 124, which are shorted together, and a second positive programming voltage of approximately 6–7 volts to drain region 116. In addition, both p-type material 112 and source region 114 are grounded.

When the positive first programming voltage is applied to contact regions 122 and 124, a positive potential is induced on floating gate 134. The positive potential induced on floating gate 134 causes an initial depletion region (not shown) to form in channel region 118, increasing the potential at the surface of channel region 118. Source region 114 then injects electrons into the surface of channel region 118 which, in turn, forms a channel of mobile electrons at the inversion layer.

The positive second programming voltage applied to drain region 116 sets up an electric field between source and drain regions 114 and 116 which then accelerates the electrons in the channel. The accelerated electrons then have ionizing collisions that form "hot channel electrons". The positive potential of floating gate 134 attracts these hot channel electrons, which penetrate gate oxide layer 130 and begin accumulating in floating gate 134 thereby raising the threshold voltage of cell 100.

Conventional EPROM cell 100 is read by applying a first positive read voltage of approximately 5 volts to contact regions 122 and 124, and a second positive read voltage of approximately 1–2 volts to drain region 116. Both p-type material 112 and source region 114 remain grounded.

Under these read bias conditions, a positive potential is induced on floating gate 134 by the above-described mechanism which is (1) sufficient, i.e., larger than the threshold voltage of the cell, to create a channel current that flows from drain region 116 to source region 114 if cell 100 has not been programmed, and (2) insufficient, i.e., less than the threshold voltage of the cell, to create the channel current if cell 100 has been programmed.

The logic state of cell 100 is then determined by comparing the channel current with a reference current.

Conventional EPROM cell 100 is erased by irradiating cell 100 with ultraviolet (UV) light to remove the electrons. The UV light increases the energy of the electrons which, in turn, allows the electrons to penetrate the surrounding layers of oxide.

C. Disadvantages of Conventional EPROM Cell

One problem with the conventional single-poly EPROM cell 100 is that this cell design is prone to leakage of gate oxide over the edge of the field oxide. Specifically, Kooi et al. have discovered that a thin layer of silicon nitride can form in the silicon during oxidation, at the interface with the pad oxide. E. Kooi et al., J. Electrochem, Soc. 123,1117 (1976).

This phenomenon, referred to as the "Kooi effect," occurs because $NH_3$ or other nitrogen compounds generated by reaction between $H_2O$ and the masking nitride during field oxide formation may diffuse through the oxide and react with the silicon substrate. When a gate oxide is subsequently grown in silicon containing this nitride, oxide growth is impeded and the gate oxide is thinned. The resulting highly localized thin gate oxide portions can in turn give rise to problems of low-voltage breakdown of the gate oxide, resulting in leakage. Such gate oxide leakage is particularly problematic in the conventional EPROM cell described above, as the integrity of the voltage stored in the floating gate must remain unaffected over long periods of time.

Therefore, there is a need for a single-poly EPROM cell design that eliminates the field oxide edge as a potential source of leakage.

A second problem of the conventional EPROM cell 100 is the relatively large amount of surface area occupied by the device. As device sizes continue to shrink in response to market demand for greater packing densities, the dimensions of the EPROM cell must also be reduced. Thus, the amount of silicon surface area consumed by EPROM cell 100 looms as an increasingly serious problem.

Much of the surface area occupied by conventional EPROM cell 100 is due to the presence of p+ contact region 122 and PLDD region 126 in n-well 120. P+ contact region 122 and PLDD region 126 are essential to the operation of conventional EPROM cell 100 because of a prior unmasked threshold voltage adjustment implant ($V_{Tp}$) into the surface of n-well 120. The relationship between P+ contact region 122, PLDD region 126, and the $V_{Tp}$ implant is now described in detail.

As discussed above, a conventional EPROM cell is programmed by applying a positive voltage to both n+ contact region 124 and p+ contact region 122. The positive voltage applied to n+ contact region 124 in conjunction with the potential of floating gate 134 draws electrons away from the surface of the n-well adjacent to control gate oxide 132.

Under the voltages typically used to program the conventional EPROM cell, the surface of n-well 120 is normally not rich enough in electrons to maintain accumulation because of a prior $V_{Tp}$ implant of p-type dopant (typically Boron) into n-well 120. This prior $V_{Tp}$ implant is unrelated to the function of the control gate region 128 of EPROM cell 100. Rather, this $V_{Tp}$ implant is utilized to adjust the threshold voltages of p-channel MOS transistors. Because the $V_{Tp}$ implant is not ordinarily masked during fabrication of conventional EPROM cell 100, p-type dopant (i.e. Boron) is introduced into the surface of n-well 120 as a side effect.

The prior VTP implant effectively reduces the available number of electrons in n-well 120 proximate to control gate region 128. Thus, as a result of the V implant, application of a typical positive programming voltage to n+ contact region 124 creates a depletion region 125 at the surface of control gate region 128.

Depletion region 125 interferes with capacitive coupling between control gate region 128 and floating gate 134. Specifically, since depletion region 125 is initially deep, the initial potential induced on floating gate 134 by control gate region 128 is reduced because the voltage applied to n+ contact region 124 is placed across both control gate oxide 132, and deep depletion region 125.

Because of the formation of the depletion region, earliest generation EPROM devices lacking p+ contact or PLDD regions in the n-well operated slowly, due to the time required for holes from thermally generated electron hole pairs to reduce the thickness of the initial deep depletion region. The resulting delay between the application of programming voltage and the appearance of sufficient programming bias upon the floating gate posed a serious drawback to these earlier devices.

P+ contact region 122, and PLDD region 126 are present in conventional EPROM cell 100 to mitigate the deleterious effect of depletion region 125 upon the capacitive coupling between control gate region 128 and floating gate 134. Specifically, the positive first programming voltage applied to p+ contact region 122 slightly forward-biases the p+ contact region to the surface of control gate region 128. As a result, p+ contact region 122 injects holes into the surface of control gate region 128, thereby inverting the surface of control gate region 128.

Holes injected by p+ contact region 122 quickly reduce the depth of depletion region 125 and form a hole inversion layer. No voltage drop occurs between n+ contact region 124 and the hole inversion layer formed underneath control gate oxide 132.

Without p+ contact region 122, few holes would accumulate at the surface of control gate region 128 upon initial depletion of the surface, because n-well 120 contains relatively few holes to begin with. Thus, the depth of the depletion region 125 could only be slowly reduced in size as thermally-generated holes drifted up to the surface of the control gate region 128.

Conventional EPROM cell 100 also requires the use of PLDD region 126. As is well known, the thickness of control gate oxide layer 132 at edge 132a adjacent to p+ contact region 122 is slightly thicker than at the central portion of gate oxide layer 132. As a result, the depletion region formed at edge 132a is too small to sufficiently invert the surface of n-well 120, which, in turn, limits the ability of p+ contact region 122 to inject holes into the surface of control gate region 128. Thus, conventional EPROM cell 100 utilizes PLDD region 126 to form a hole injection region that adjoins the surface region of control gate region 128.

To summarize, the initial potential induced on floating gate 134 is defined by the voltage applied to contact regions 122 and 124, and by the thickness of control gate oxide 132 (which defines the coupling ratio between n-well 120 and floating gate 134). Application of a first positive programming voltage to n-well 120 causes an initially deep depletion region 125 to appear in the control gate region 128. P+ region 122 and PLDD region 126 allow for rapid reduction in the depth of the depletion region 125, and the formation of a hole inversion layer. This resulting hole inversion layer facilitates effective capacitive coupling between control gate region 128 and floating gate 134, permitting the full positive programming potential to be rapidly induced upon floating gate 134.

Conventional EPROM cell 100 is a functional device. However, p+ contact region 122 and PLDD region 126 occupy a significant amount of silicon surface area. Therefore, there is a need for an EPROM cell design that eliminates the p+ and PLDD structures while rapidly establishing strong enough capacitive coupling between the control gate region and the floating gate to program the floating gate.

SUMMARY OF THE INVENTION

Unwanted leakage through the gate oxide of a conventional single-poly EPROM cell is prevented by eliminating the field oxide isolating the source, channel, and drain from the control gate n-well, and by replacing the field oxide surrounding the cell with a heavily doped surface isolation region. Elimination of the field oxide in this manner prevents gate oxide over the field oxide edge from serving as a leakage path, thereby prolonging the retention of data by the floating gate.

The EPROM cell in accordance with the present invention also utilizes a floating gate having an open-rectangular floating gate portion over the control gate connected to a narrow floating gate portion over the channel and the silicon substrate. The large surface area of the open-rectangular floating gate portion ensures a high coupling ratio with the control gate. The small width of the narrow floating gate portion prevents formation of a sizeable leakage path between the n-well and the source, channel, and drain.

In order to conserve precious silicon surface area, the EPROM cell of the present invention also eliminates the p+ contact region and the PLDD region from the control gate well. This is permitted because the VTP implant step is masked, allowing the control gate region to operate in accumulation mode during application of typical programming and read voltages of 5V.

An exemplary EPROM cell in accordance with the present invention includes a source and a drain of a second conductivity type formed in the semiconductor material of the first conductivity type. The source and drain define a channel of a first conductivity type between them. The cell further includes a well of the second conductivity type formed in the semiconductor material, the well defining an intervening region of semiconductor material between the well and the channel. The cell also includes a heavily doped contact region of the second conductivity type formed in a first central region of the well, and a control gate region formed by the well and the heavily doped contact region. A single oxide layer provides a floating gate oxide over the channel, an isolation oxide over the intervening region, and an open-rectangular control gate oxide over a second central portion of the well. A floating gate includes an open-rectangular floating gate portion formed over the open-rectangular control gate oxide, and a narrow floating gate portion formed over the floating gate oxide and the isolation oxide.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 1A is a top view of cell 100. FIG. 1B is a cross-sectional view along line 1B–1B' of FIG. 1A. FIG. 1C is a cross-sectional view along line 1C–1C' of FIG. 1A.

FIG. 2A is a plan view of cell 200. FIG. 2B is a cross-sectional view along line 1B–1B' of FIG. 2A, FIG. 2C is a cross-sectional view along line 1C–1C' of FIG. 2A. FIG. 2D is a cross-sectional view along line 1D–1D' of FIG. 2A, illustrating a minor leakage path that may arise during programming of the EPROM cell in accordance with the first embodiment of the present invention.

FIGS. 4A–4B are a series of views illustrating a single-poly EPROM cell 400 in accordance with a second embodiment of the present invention. FIG. 4A is a plan view of cell 400. FIG. 4B is a cross-sectional view of cell 400 along line 4B–4B' of FIG. 4A.

DETAILED DESCRIPTION

Figure 2A:
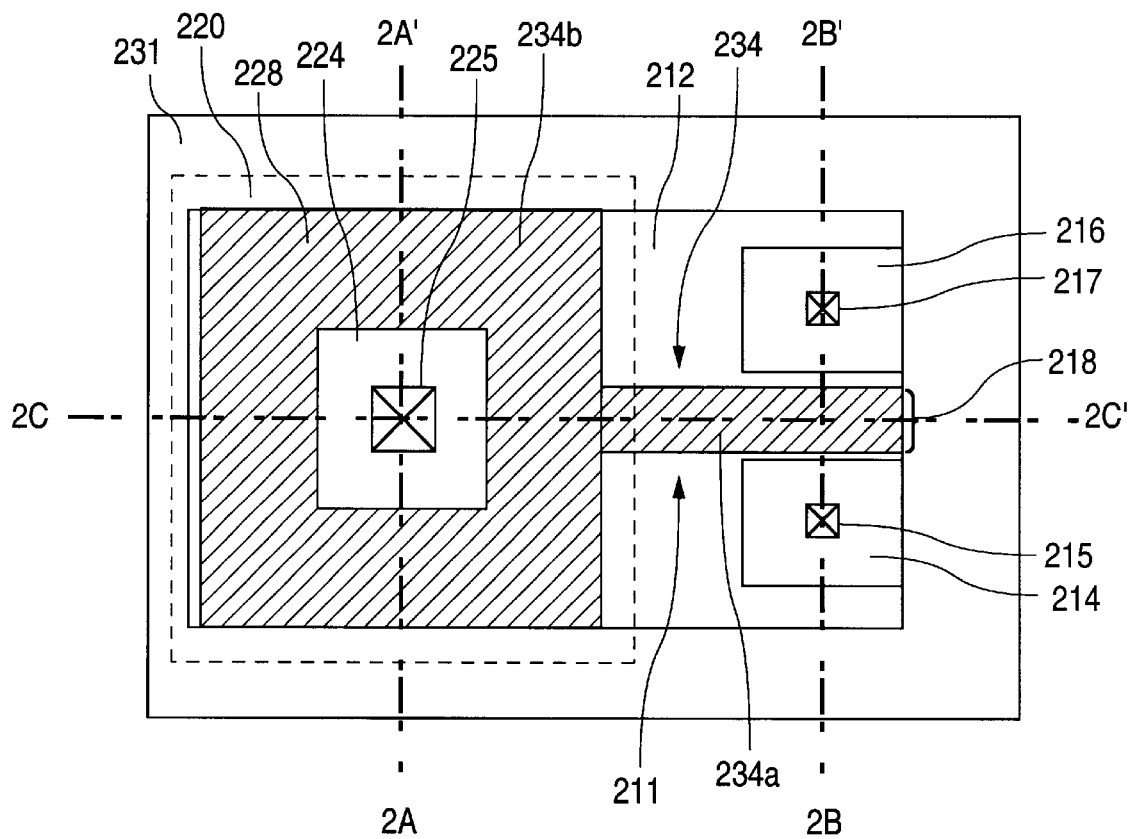
FIGS. 2A–2D are a series of views illustrating a single-poly EPROM cell 200 in accordance with a first embodiment of the present invention.
Figure 2B:
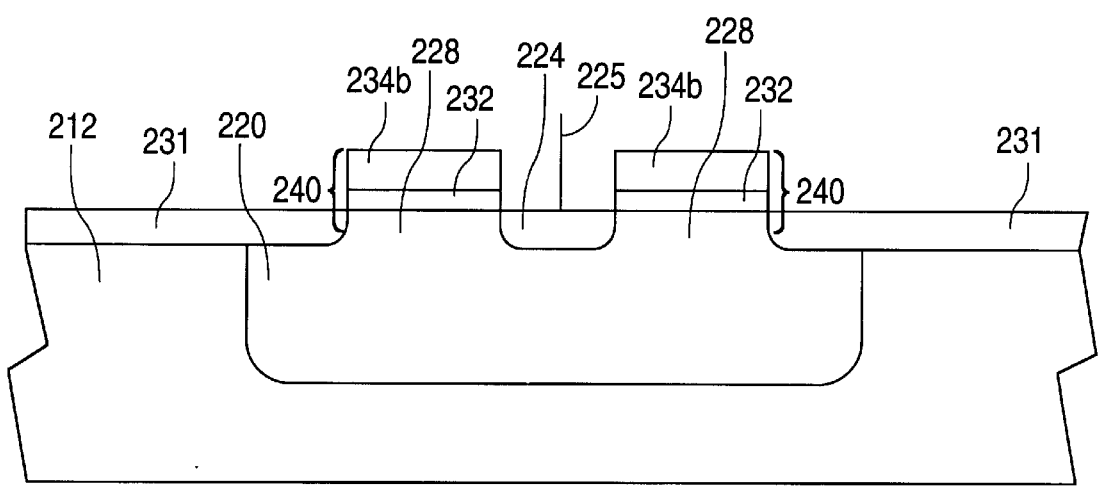
Figure 2C:
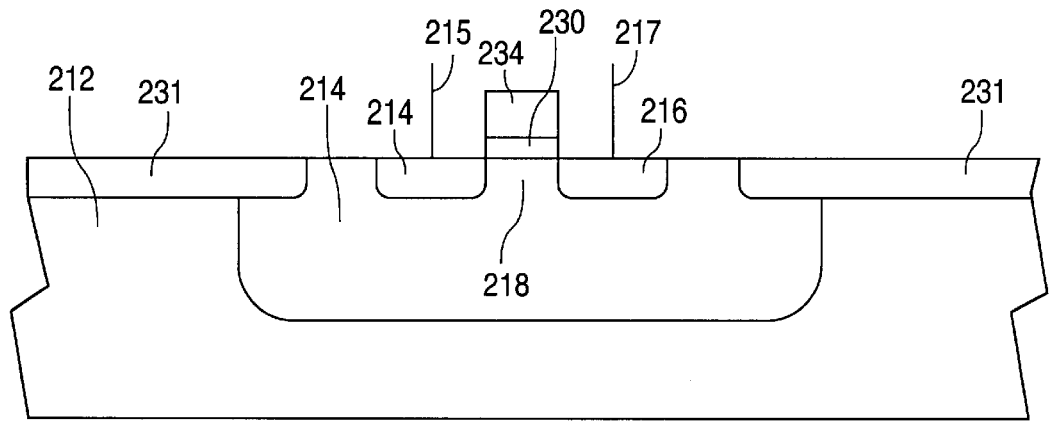
Figure 2D:
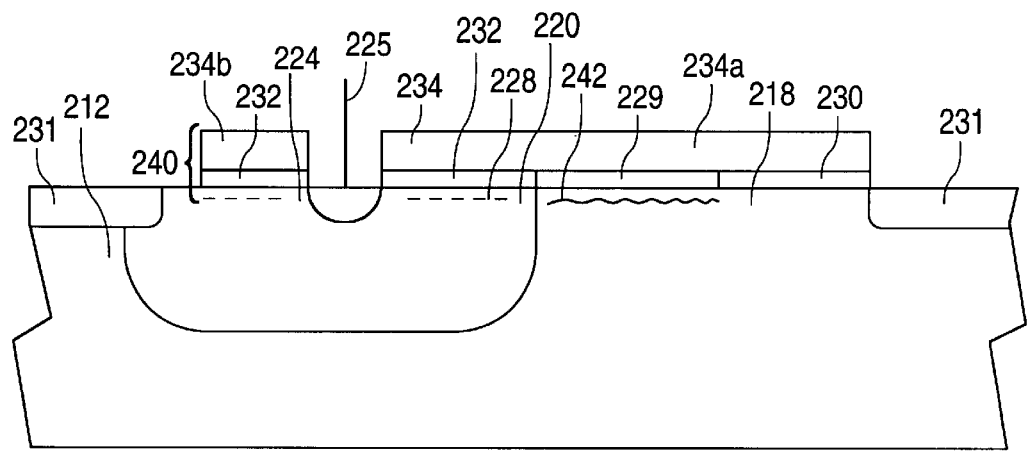

FIGS. 2A–2D show a series of views that illustrate a single-poly EPROM cell 200 in accordance with a first embodiment of the present invention. FIG. 2A shows a top view of cell 200. FIG. 2B shows a cross-sectional view along line 1B–1B' of FIG. 2A. FIG. 2C shows a cross-sectional view along line 1C–1C' of FIG. 2A. FIG. 2D shows a cross-sectional view along line 1D–1D' of FIG. 2A.

Figure 1A:
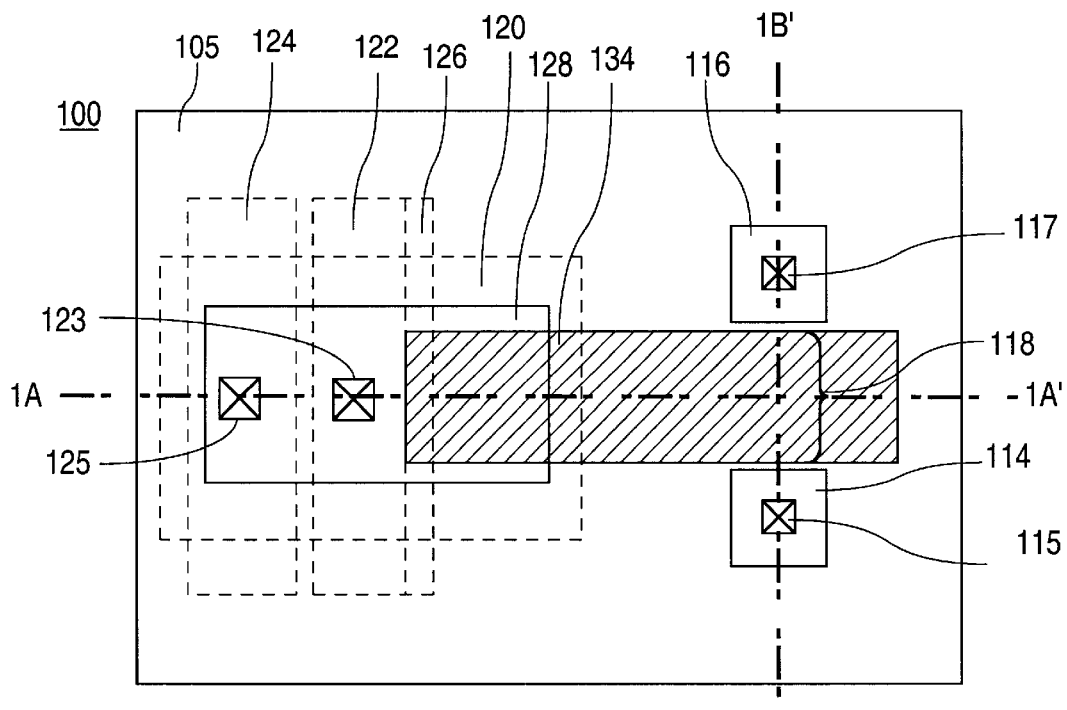
FIGS. 1A–1C are a series of views illustrating a conventional single-poly EPROM cell 100.
Figure 1B:
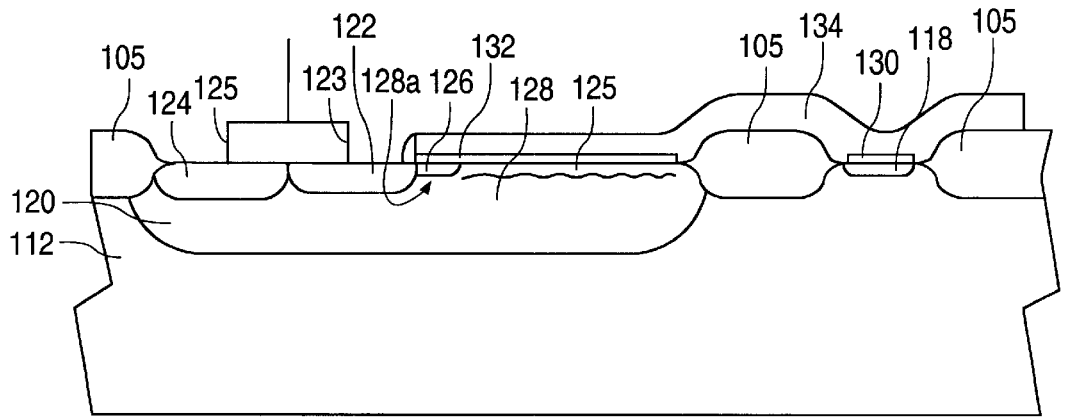
Figure 1C:
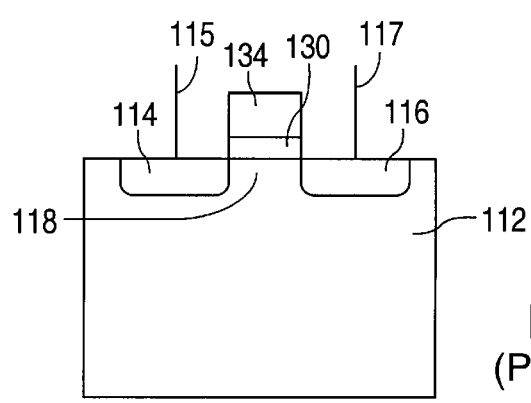

As shown in FIGS. 2A–2D, EPROM cell 200 is structurally similar to EPROM cell 100 of FIG. 1. Thus, similar reference numerals are utilized to designate structures which are common to both cells.

As shown in FIGS. 2A–2D, EPROM cell 200 includes spaced-apart source and drain regions 214 and 216 respectively, which are formed in a p-type semiconductor material 212 such as a well or a substrate, and a channel region 218 which is defined between source and drain regions 214 and 216. Source region 214 includes source contact 215. Drain region 216 includes drain contact 217.

As further shown in FIGS. 2A–2D, cell 200 also includes an n-well 220 formed in p-type material 212. Intervening silicon region 211 is defined between n-well 220 and channel region 218.

EPROM cell 200 further includes an n+ contact region 224 which is formed in n-well 220. N+ contact region 224 has an n+ contact 225. Open-rectangular control gate region 228 is the surface of both n-well 220 and n+ contact region 224. The surface dopant concentration in the control gate region 228 of n-well 220 is approximately the same as in the remainder of n-well 220, approximately $1 \times 10^{18} - 1 \times 10^{19}$ atoms/cm3 for a $0.25\mu$ device and approximately $1 \times 10^{19} - 5 \times 10^{19}$ atoms/cm$^3$ for a $0.25\mu$ device.

Floating gate oxide 230 is formed over channel region 218. Open-rectangular control gate oxide 232 is formed over the center of control gate region 228. Isolation oxide 229 is formed over intervening silicon region 211. Floating gate oxide layer 230, control gate oxide layer 232, and isolation oxide 229 are typically grown as a single layer at the same time during fabrication of cell 200. As a result, oxides 229, 230, and 232, have substantially the same thickness, e.g. approximately 120 Å for 0.5 micron technology, and 70 Å for 0.35 micron technology.

Floating gate 234 consists of narrow floating gate portion 234a and an open-rectangular floating gate portion 234b. Narrow floating gate portion 234a is formed over floating gate oxide 230 and isolation oxide 229. Open-rectangular floating gate portion 234b is formed over open-rectangular control gate oxide 232.

A heavily doped p type isolation region 231 circumscribes source 214, drain 216, channel 218, n-well 220 and intervening region 211, isolating these components of cell 200 from the electrical fields of nearby cells.

In operation, cell 200 is programmed in a manner similar to conventional EPROM cell 100 but with bias voltages of a different magnitude. Specifically, first and second positive programming voltages of approximately 5 volts are applied to n+ contact region 224 and drain region 216, respectively. Both p-type semiconductor material 212 and source region 214 are grounded. As a result of this programming voltage bias combination, electrons accumulate in floating gate 234.

When the first positive programming voltage is applied to n+ contact 224, electrons are drawn away from the control gate region 228 to the center of n+ contact region 224. In the present invention, the surface dopant concentration of control gate region 228 is higher than in the prior art because the $V_{Tp}$ implant is masked from n-well 220. Therefore, because there has been no prior $V_{Tp}$ implant into the n-well 220, under programming voltages of 5V the surface of control gate region 228 continues to operate in accumulation mode with no depletion region being formed.

As a result, in the absence of the $V_{Tp}$ implant, programming takes place in approximately the same amount of time as a conventional single poly EPROM cell that utilizes p+ and PLDD regions. Moreover, programming of the cell may be accomplished by the application of a programming voltage of approximately 5V rather than the 12V required by the prior art device.

EPROM cell 200 is read in a similar manner as conventional EPROM cell 100. A first positive read voltage of approximately 5 volts is applied to contact region 224, and a second positive read voltage of approximately 1–2 volts is applied to drain region 216. Both p-type material 212 and source region 214 remain grounded.

Under these read bias conditions, a positive potential is induced on floating gate 234 by the above-described mechanism which is (1) sufficient, i.e., larger than the threshold voltage of the cell, to create a channel current that flows from drain region 216 to source region 214 if cell 200 has not been programmed, and (2) insufficient, i.e., less than the threshold voltage of the cell, to create the channel current if cell 100 has been programmed.

The logic state of cell 200 is then determined by comparing the channel current with a reference current.

EPROM cell 200 in accordance with the present invention is erased by irradiating cell 200 with ultraviolet (UV) light to remove the electrons. The UV light increases the energy of the electrons which, in turn, allows the electrons to penetrate the surrounding layers of oxide.

EPROM cell 200 differs primarily from conventional EPROM cell 100 in three important respects. First, there is no field oxide present in EPROM cell 200. The absence of field oxide eliminates a possible gate oxide leakage pathway along the field oxide edge due to the Kooi effect.

EPROM cell 200 also differs from conventional EPROM cell 100 in that cell 200 does not require p+ contact or PLDD regions in the n-well. This is because the $V_{TP}$ implant is masked from the surface of the N-well with no penalty in the form of additional process steps.

Absent the $V_{TP}$ implant, the control gate region remains in accumulation even under conditions favoring inversion, such as when a smaller programming bias (e.g. 5V rather than 12V) is applied at n+ contact 224 and the floating gate potential is slightly lower than the n-well potential. FIG. 2B shows that capacitor 240 consisting of control gate region 228, open-rectangular floating gate portion 234b, and open-rectangular control gate oxide 232, operates in accumulation mode, with no depletion region being formed.

Elimination of the p+ contact and PLDD regions permits EPROM device 200 to occupy significantly less space, thereby conserving precious silicon surface area. Specifically, the area of an EPROM cell in accordance with one embodiment of the present invention is about 38 $\mu m^2$ (7.7 $\mu m \times 5$ $\mu m$), based upon 0.35$\mu$ CMOS technology. This translates into a storage capacity of 64K bits of information in a space occupying 2.4% of the surface area of a 1 cm² silicon substrate.

EPROM cell 200 further differs from conventional EPROM cell 100 in that conventional rectangular control gate oxide 132 and rectangular floating gate 134 have been replaced with an open-rectangular control gate oxide 232 and floating gate 234 having narrow portion 234a and open-rectangular portion 234b. A large coupling ratio (5.7:1) is ensured by this design of EPROM cell 200 because of the large surface area between control gate region 228 and open-rectangular control gate oxide 232.

FIG. 2D shows that during programming of EPROM cell 200, a minor leakage path 242 will form between n-well 220 and both source 214 and drain 216. Leakage path 242 is due to the existence of a parasitic transistor having source 214 and drain 216 as source, intervening region 211 as channel, narrow floating gate portion 234b as gate, and n-well 220 as drain.

Figure 3:
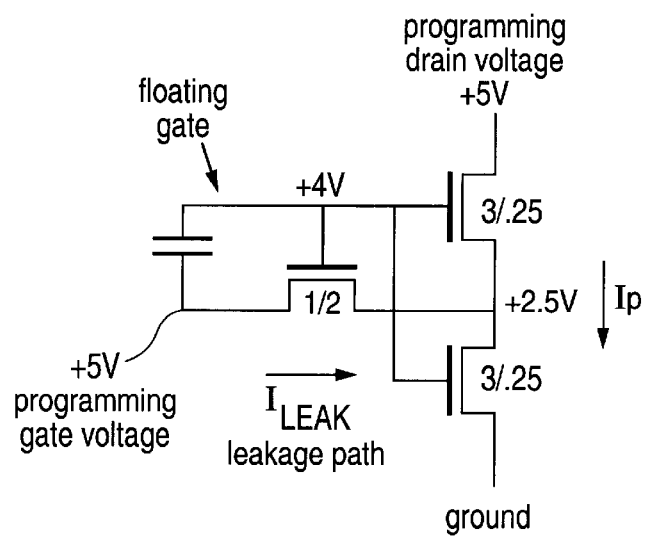
FIG. 3 is a circuit schematic depicting operation of the EPROM cell in accordance with the first embodiment of the present invention.

FIG. 3 is a schematic diagram of the circuit formed by EPROM cell 200. FIG. 3 illustrates that the leakage current ($I_{leak}$) along leakage path 242 would be only about 10% of the programming current ($I_p$). This is because the W/L of the parasitic leakage transistor is approximately ⅒th the W/L (3/.25) of the MOS transistor formed by source 214, channel 218, floating gate 234, and drain 216. Thus, the current along leakage path 242 would not significantly affect the programming efficiency of EPROM cell 200.

Narrow floating gate portion 234a will exert some potential across isolation oxide 229, forming a channel as leakage path 242 through intervening region 211. However, the large coupling ratio afforded by open-rectangular control gate oxide 232 and open-rectangular floating gate portion 234b will ensure that most of the floating gate 234 is subjected to a voltage equal to the full first positive programming voltage.

The various features of the present invention have been illustrated in connection with an EPROM cell design that combines (1) p+ isolation in lieu of field oxide, (2) a floating gate having an open-rectangular portion formed on top of an open-rectangular control gate oxide, (3) elimination of p+ contact and PLDD regions, and (4) programming voltages of approximately 5V rather than the 12V required for the prior art device. However, it is important to recognize that each of the above characteristics represents a separate and independent feature of the EPROM cell design in accordance with the present invention.

Accordingly, FIGS. 4A and 4B show a series of views illustrating a single-poly EPROM cell 400 in accordance with a second embodiment of the present invention. FIG. 4A is a plan view of cell 400. FIG. 4B is a cross-sectional view of cell 400 along line 4B–4B' of FIG. 4A.

EPROM cell 400 includes floating gate 434 having narrow floating gate portion 434a and open-rectangular floating gate portion 434b. Open rectangular floating gate portion 434b overlies and separated from n-well 420 by control gate oxide 432. Open-rectangular floating gate portion 434b surrounds n-well contact region 424.

Cell 400 also includes a p+ and pldd regions 422 and 426 respectively, pldd region 426 underlying a peripheral portion of control gate oxide 432. During operation of cell 400, pldd region 426 injects holes into the surface of control gate region 428 and thereby mitigates the deleterious effect of any depletion region upon capacitive coupling between control gate 428 and floating gate 434.

Cell 400 is isolated from surrounding devices by a heavily doped p-type isolation region 431. Source 414, drain 416, and intervening channel region 418 are isolated from n-well 420 by field oxide structure 405.

Moreover, it is also important to recognize that an EPROM cell in accordance with the present invention need not have the precise physical dimensions discussed above in connection with the first embodiment shown in FIGS. 2A–2D.

Therefore, it is intended that the following claims define the scope of the invention and that methods and structures within the scope of these claims and their equivalents be covered thereby.

What is claimed is:

1. A memory cell structure comprising:
   a semiconductor material having a first conductivity type;
   spaced-apart source and drain regions formed in the semiconductor material, the source and drain regions having a second conductivity type opposite the first conductivity type and defining a channel region having the first conductivity type therebetween;
   a well region having the second conductivity type formed in the semiconductor material, the well region being spaced-apart from the source and drain region to define an intervening region of said semiconductor material therebetween, the well region, intervening region of said semiconductor material and the channel region having substantially co-planar upper surfaces;

a contact region having the second conductivity type formed in a first central portion of the well region;

a unitary region of dielectric material having a first open-rectangle portion formed on the upper surface of the well region around the perimeter of the contact region, a second portion that is connected to the first open-rectangle portion and is formed at the upper surface of the intervening region of said semiconductor material, and a third portion that is connected to the second portion and is formed on the upper surface of the channel region;

a unitary region of conductive material having a first open-rectangle portion formed on the first open-rectangle portion of the dielectric material and a second portion that is connected to the first open-rectangle portion and is formed on the second and third portion of the dielectric material; and a perimeter doped region having the first conductivity type that is formed in the semiconductor material and circumscribes the source region, the drain region, the well region and the intervening region.

2. The memory cell structure of claim 1, and wherein the well region and the contact region define a control gate region of the memory cell structure, and wherein the control gate region has a sufficiently high concentration of dopant of the second conductivity type such that no depletion region forms in the control gate region during application of 5V or less to the contact region.

3. The memory cell structure of claim 1, and wherein the semiconductor material is p-type silicon.

\* \* \* \* \*